United States Patent [19]
Pearson et al.
[11] 3,852,794
[45] Dec. 3, 1974

[54] HIGH SPEED BULK SEMICONDUCTOR MICROWAVE SWITCH

[75] Inventors: Gerald L. Pearson, Portola Valley; Giovanni A. Foggiato, Cupertino, both of Calif.

[73] Assignee: The Board of Trustees of Leland Stanford Junior University, Stanford, Calif.

[22] Filed: May 11, 1972

[21] Appl. No.: 252,423

[52] U.S. Cl. .................... 357/3, 331/107 G, 357/55, 357/61
[51] Int. Cl. .... H03k 17/56, H03k 17/74, H01p 1/10
[58] Field of Search ............ 331/107 G; 317/234 V, 317/235 AP

[56] References Cited

UNITED STATES PATENTS

| | | | |
|---|---|---|---|
| 3,336,535 | 8/1967 | Mosher | 317/234 V |
| 3,614,549 | 10/1971 | Lorenz et al. | 317/235 AP |

OTHER PUBLICATIONS

Shyam et al., IEEE Trans. on Electron Devices, Vol. Ed 13, No. 1, Jan. 1966, pp. 63–67.

Allen et al., Applied Physics Letters, Vol. 7, No. 4, Aug, 15, 1965, pp. 78–80.

C. Hilsum, "Transferred Electron Amplifiers and Oscillators", Proc. IRE, pp. 185–189, Feb. 1962.

*Primary Examiner*—Rudolph V. Rolinec
*Assistant Examiner*—William D. Larkins
*Attorney, Agent, or Firm*—Flehr, Hohbach, Test, Albritton & Herbert

[57] ABSTRACT

A bulk semiconductor switching device formed of compounds of material selected from columns III and V of the Periodic Table which switches from a high conduction state to a current saturation state responsive to applied electric fields in times determined by electron heating and scattering within the bulk of the device.

2 Claims, 13 Drawing Figures

HIGH SPEED BULK SEMICONDUCTOR MICROWAVE SWITCH

GOVERNMENT RIGHTS

The invention herein described was made in the course of or under a contract with the Department of the Navy.

BACKGROUND OF THE INVENTION

This invention relates generally to switching devices and more particularly to a bulk semiconductor microwave switching device.

High speed switching is important in the areas of microwave communication and data transmission. Present devices used for microwave switching, such as PIN diodes, have fundamental limitations imposed by the transit time required for electrons to traverse the intrinsic region. A finite time is required to deplete the intrinsic region in order to change the microwave impedance levels. Presently available devices have switching times of about 5 nanoseconds, however, to switch high power microwave signals, the intrinsic layer of the PIN diode must be relatively thick. Consequently, a compromise must be made between the switching time and power handling capability. In both PIN and PN junction devices, frequency limitations are imposed by the capacitance associated with the junction.

Other devices having microwave switching capabilities are known. The step recovery diode can be switched in one nanosecond but achievable isolation is poor and only suitable in special applications. Modifications of the PIN diode or PN junction devices such as the Schottky barrier diode has resulted in faster devices with much lower power handling capability. In some applications, this latter limitation is overcome by using an array of diodes or junction devices.

PIN diodes and bulk silicon resistors have been used as microwave limiters capable of handling moderate power levels. Since any high power pulsed microwave signal must deplete the intrinsic region, the limiting response is slow allowing transients to bypass the limiters. Consequently, these devices are limited in their use for protection of sensitive microwave receivers.

Another application of such devices in the microwave region of the frequency spectrum is in mixers. Currently available millimeter wave mixers utilize point contact diodes with their inherent frequency limitations due to lead inductance and diode capacitance. Although Schottky barrier hot carrier diodes are also used, their lack of ability to withstand large microwave energy bursts limits the applications to relatively low microwave energies.

OBJECTS AND SUMMARY OF THE INVENTION

It is a general object of the present invention to provide a high speed switching device.

It is another object to provide a bulk semiconductor switching device utilizing ternary compounds of elements selected from Groups III and V of the Periodic Table.

It is another object of the invention to provide a device which switches in a time limited only by the time required for heating and intervalley transfer of electrons.

It is a further object of the present invention to provide a switching device capable of being used for microwave switching, mixing, and limiting.

It is a further object of the present invention to provide a bulk semiconductor switching device having high differential impedance when biased in the high field region.

It is another object of the present invention to provide a bulk semiconductor device which can be used as a high speed microwave limiter to protect sensitive microwave receivers.

It is still a further object of the present invention to provide a bulk semiconductor device which, due to its symmetrical current-voltage characteristics, can be used as a balanced modulator.

The foregoing and other objects of the invention are achieved by a device comprising a body of n-type semiconductor material composed of a ternary compound of materials selected from columns III and V of the Periodic Table in such proportions as to establish an energy band structure whereby a high differential resistance is established. The more suitable materials must have low free carrier concentrations in the $10^{15}$ $cm^{-3}$ range to limit the total current and prevent electron ionization at high electric fields.

Figure 8A:
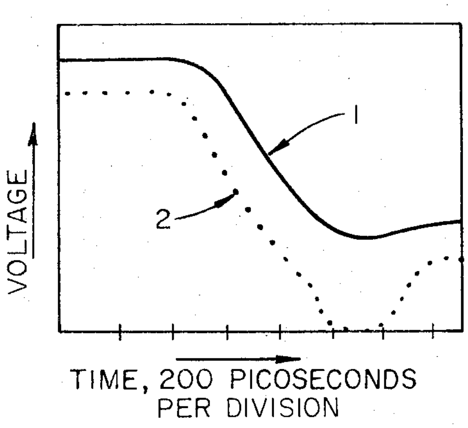
Figure 8B:
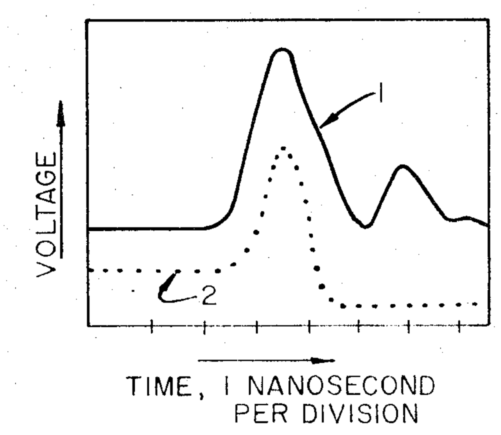

FIGS. **8*a*–8*b* illustrate the high speed switching capability of the $GaAs_{0.7}P_{0.3}$ microwave switch with a modulated microwave signal having a pulse fall time of 500 picoseconds, FIG. 8*a*, and a 2 nanosecond pulse formed by modulation of a microwave signal, FIG. 8*b***.

Figure 9:
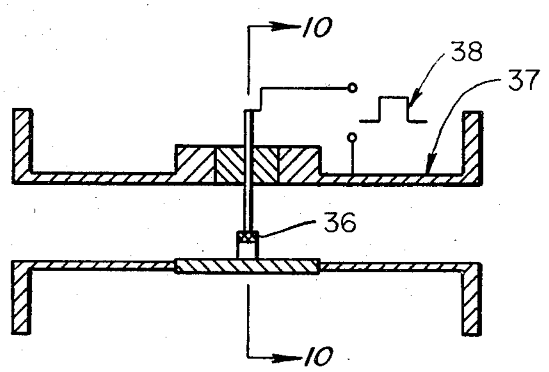
Figure 10:
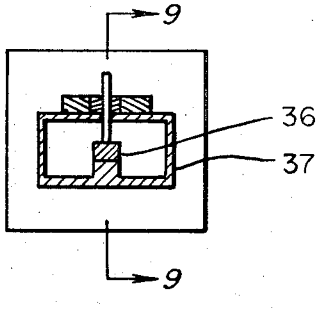

FIG. 9 is a sectional view taken along the line 9—9 of FIG. 10 schematically showing a switching device employed as a microwave switch in a rectangular wave guide.

FIG. 10 is a sectional view taken along the line 10—10 of FIG. 9.

Figure 11:
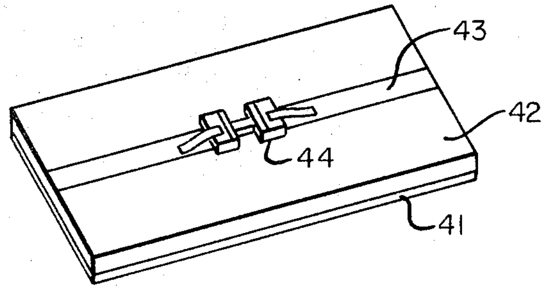

FIG. 11 shows a dumbbell bulk switching device employed on a microwave microstrip transmission line.

Figure 12:
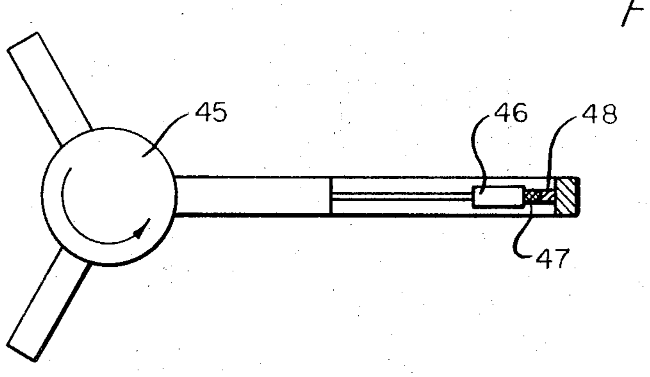

FIG. 12 shows a mesa bulk switching device employed in a coaxial circuit suitable for microwave signal modulation.

DESCRIPTION OF PREFERRED EMBODIMENTS

Figure 1:
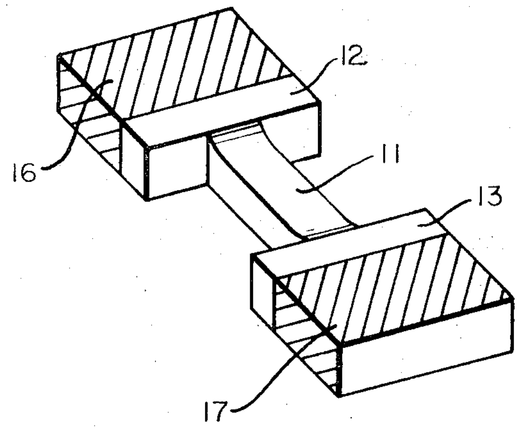
FIG. 1 is a perspective view of a bulk semiconductor microwave switching device in accordance with the invention having a dumbbell geometry.

Various geometries of the bulk semiconductor switching device are shown in FIGS. 1–4. Referring to FIG. 1, the device has a dumbbell structure, that is, it has an active region 11 disposed between enlarged contact portions 12 and 13. The bulk device is comprised of a ternary compound selected from Groups III and V of the Periodic Table in ratios to be presently described. Ohmic contacts 16 and 17 are formed on the enlarged ends 12 and 13, respectively. Such a contact may consist of an alloy of AuGe in the proportions of 88:12 with a Ni overlay. A configuration such as shown in FIG. 1 is suitable in switching applications where the geometrical symmetry of FIG. 1 is useful. Such applications also include modulators and mixers where symmetrical current-voltage characteristics are required.

Figure 2:
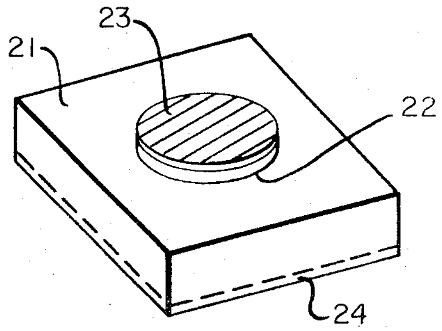
FIG. 2 is a perspective view of a bulk semiconductor device in accordance with the invention having a mesa geometry.

The device can take the form of the mesa structure shown in FIG. 2 with a bulk body 21 formed of a ternary compound and including a mesa 22 with ohmic contacts 23 formed on the mesa and 24 on the body. Again, the ohmic contacts may be of the type described or other suitable materials. This configuration is most amendable to widespread application since when suitably mounted with the mesa bonded to a heat sink, the device may be operated at high switching rates.

Figure 3:
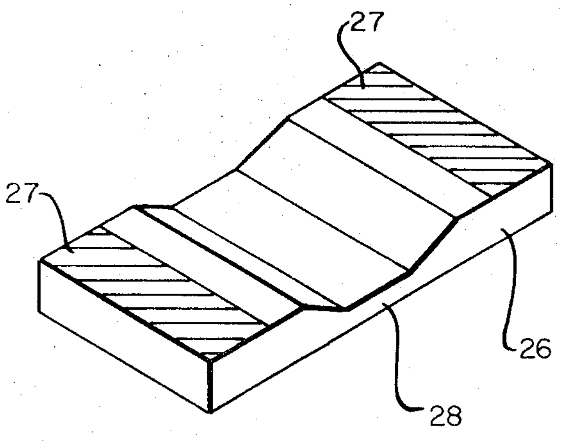
FIG. 3 is a perspective view of a bulk semiconductor device in accordance with the invention having a coplanar geometry.

FIG. 3 shows a bulk coplanar semiconductor switching device which has a body 26, planar ohmic contacts 27, and a thin active region. The device has a large high to low field resistance ratio because the active region is well defined.

Figure 4:
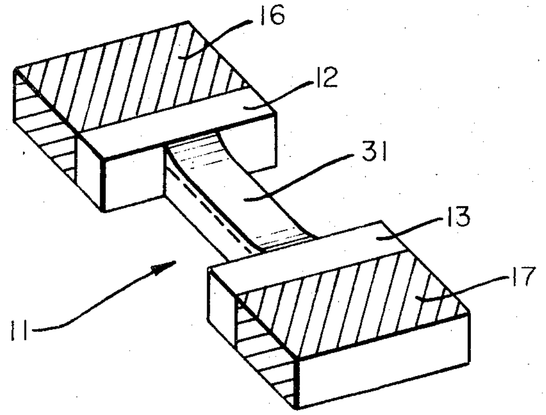
FIG. 4 is a perspective view of a bulk semiconductor device of the dumbbell type protected by a silicon dioxide layer.

Finally, FIG. 4 shows another dumbbell device similar to that of FIG. 1 and carrying like reference numerals. However, the active region of the semiconductor device is provided with a silicon dioxide overlay shown in dotted line and which overlay serves to protect the structure and permit it to operate at higher power capacities. The dielectric covering in FIG. 4 improves its power handling capacity by reducing the formation of high frequency plasmas when the RF peak fields approach the avalanche limits on the device surface.

Figure 7:
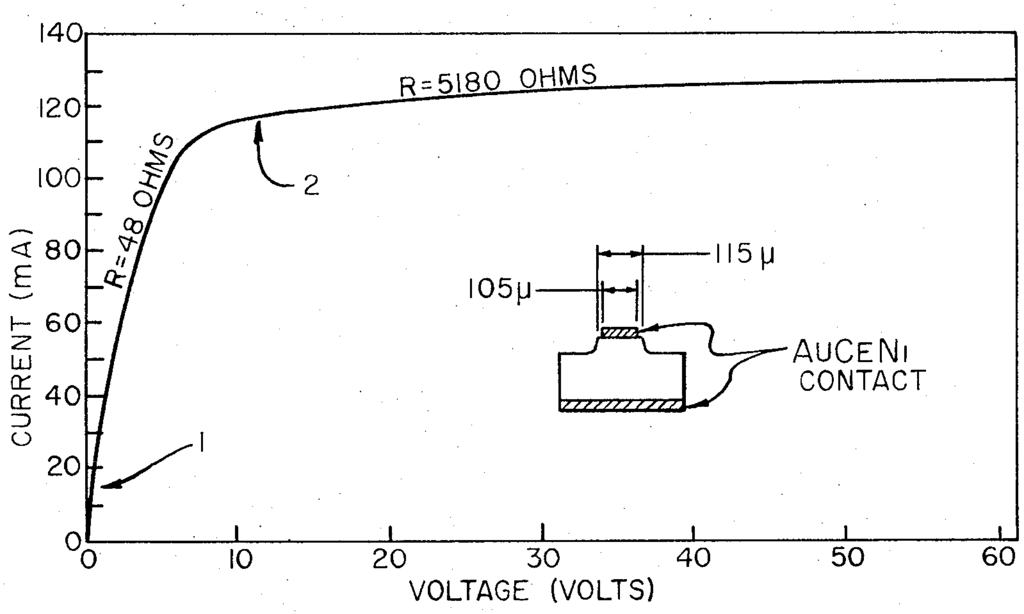
FIG. 7 shows the current voltage characteristic for a mesa device in accordance with the present invention.

The devices described are switched from a low resistance (high conductance state) to a high resistance (current saturation) state responsive to applied electric field. The current-voltage characteristic of a mesa device such as shown in FIG. 2 is shown in FIG. 7. It is observed that the high to low voltage resistance ratio is more than 100. The characteristic shown was obtained by applying voltage pulses to a device of the type shown.

Figure 6:
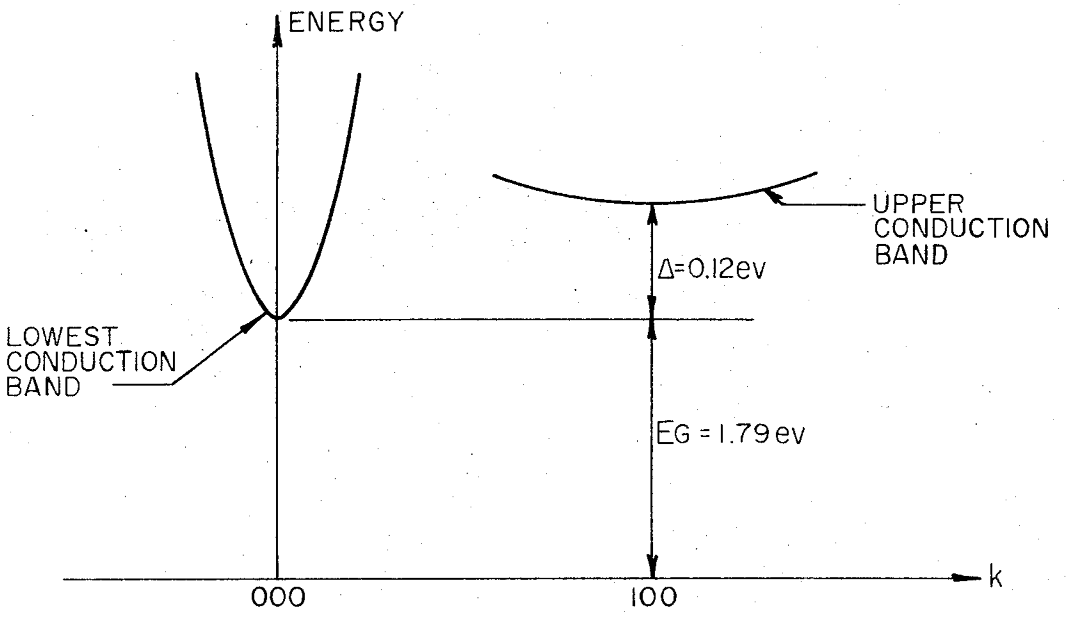
FIG. 6 is the energy band diagram for a $GaAs_{0.7}P_{0.3}$ bulk semiconductor device.

As previously described, prior state of the art semiconductor switching devices of the PIN and PN type have relatively low switching times on the order of 1 to 5 nanoseconds. The bulk semiconductor switching device of the present invention has relatively fast switching or response time. The switching time is determined by the time required for heating followed by intervalley transfer of electrons. Referring to FIG. 6, it is seen that electrons transfer from the lowest conduction band to the upper conduction band with the application of a voltage which increases the electron energy by 0.12 electron volts. The electrons gain energy by polar optical interactions and scatter into the adjoining low mobility energy band. Within the central conduction energy band, the electron mobility for $GaAs_{0.7}P_{0.3}$ is approximately 3,500 $cm^2$/v-sec whereas upon scattering, the mobility is reduced to 150 $cm^2$/v-sec. The mobility change is seen as a saturation of the current density for increases in electric field.

The response or switching time to achieve maximum microwave isolation is made up of two components: the time required to heat the electrons to energies greater than 0.12 electron volts above the equilibrium value in the lower conduction band, and the intervalley scattering time. The intervalley scattering time has been calculated to be less than $10^{-12}$ seconds for electrons having energies of 0.01 electron volts above that required for intervalley scattering. To achieve sufficient energy for intervalley transfer from the electric field, a number of scattering processes are overcome, the dominant one being due to polar phonons. The maximum time required has been estimated to be on the order of 10 picoseconds such that in theory, the ultimate switching time can be as low as 20 picoseconds. Waveforms 1 and 2 presented in FIGS. **8*a* and 8*b* illustrate the switching capability as determined with limited measurement equipment. Waveform 1 is the bias voltage pulse applied to the bulk diode used to modulate a continuous microwave signal. Waveform 2 is the corresponding modulated RF signal which follows exactly the voltage pulse. FIG. 8 *a* demonstrates a switching time of less than 500 picoseconds. FIG. 8*b* illustrates a 2 nanosecond RF pulse waveform 2 generated by the bias pulse depicted by the solid line waveform 1. Other experimental data have indicated that switching times of less than 200 picoseconds are attainable, but suitable measurement equipment must be developed. Future microwave data communication systems operating at 700 to 1,000** megabit modulation rates require switching capability in the 200 picosecond range; thus this device clearly fulfills requirements imposed by high speed data communications.

Figure 5:
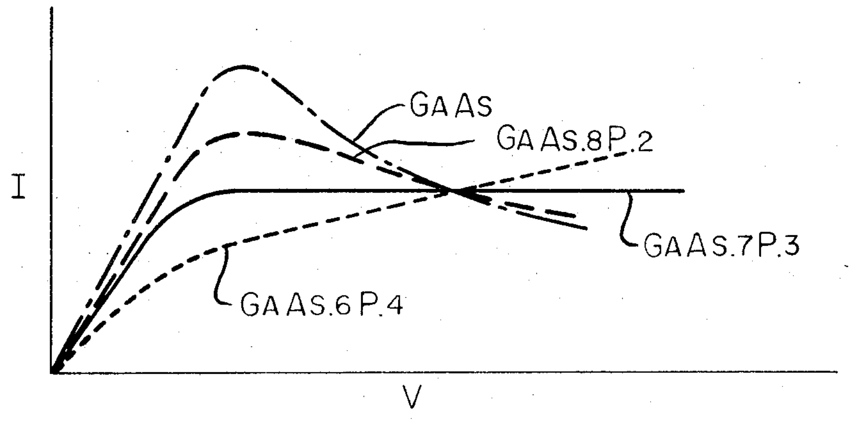
FIG. 5 depicts curves showing the current voltage characteristics for $GaAs_{l-x}P_x$ mixed crystals for various values of $x$.

One ternary compound selected from Groups III and V of the Periodic Table which has been found especially useful is gallium-arsenide-phosphide having a composition: $GaAs_{1-x}P_x$. The proportions of the constituents are selected so that the negative resistance is suppressed due to velocity saturation at high electric fields resulting in the flat current-field characteristics. To determine the optimum composition for true saturation, the velocity-field characteristics of alloys are deduced from current-voltage measurements such as shown in FIG. 5.

It is seen that for gallium arsenide, GaAs, the device has a large change in differential resistance and for fields higher than a threshold value displays a negative resistance. As phosphorus is added, the negative resistance is reduced to the point whereat $x$ is 0.30, the current-voltage characteristic saturates and no negative resistance is present. For phosphorus compositions greater than 0.30, the current increases for all ranges of voltages. Thus, by plotting the current-voltage characteristics for various proportions of the materials forming the mixed crystals, one is able to select the appropriate mixture to obtain a microwave switching device which switches from a low resistance to a high resistance with current saturation.

Now referring again to FIG. 7, the current-voltage characteristic for a $GaAs_{0.7}P_{0.3}$ device is shown. It is seen that high field resistance is attained at three times the threshold voltage of approximately 6 volts wherein the resistance exceeds 5,000 ohms. This yields a low-to-high field impedance ratio of over 100. Considering the microwave circuit isolation attainable, calculations yield values of 20 db, whereas actual microwave measurements near 10 GHz yielded values of 17 db for a 1

GHz bandwidth. The insertion losses are less than 1 db with the Q of the device being greater than 10.

Other ternary compounds can be used utilizing different $n$-type III-V materials having carrier concentrations in the $10^{15}$ $cm^{-3}$ range. Two additional materials are GaInP and GaAlAs. Since InP and GaAs display negative conductivities when biased above a certain threshold electric field, suitable mixed alloys of InP and GaP or GaAs and AlAs exhibit current voltage characteristics similar to that shown in FIG. 7. By adding about 60 percent of GaP to InP, saturation characteristics can be achieved at electric fields of about 12 kilovolts per cm. Similarly, for GaAlAs, the composition may be $Ga_{0.6}Al_{0.4}As$ with a threshold field in the range of 3.5 kilovolts per cm.

It can be seen that the device can be used as a microwave limiter and its high speed switching capability renders it very useful for receiver protection applications. Transients which bypass the currently used TR switches are harmful to the circuits of the sensitive receiver. However, in the present device, limiting is attained as soon as the transient electric field, be it RF or in the form of distorted pulses or noise, reaches the threshold field of the device since switching is almost instantaneous, on the order of 20 picoseconds or less.

Since the device is symmetrical in its current-voltage characteristic, a device having symmetrical geometry can be used as a balance modulator where currently two non-linear devices must be used with proper filtering circuits to select the desired modulation carrier. The bulk device provides filtering action through the cancellation of all even harmonics when used as the non-linear element in a balanced modulator. Filter requirements are eased since the harmonic which must be cancelled is $f_0 + 3f_m$ rather than $f_0 + 2f_m$ where $f_o$ is the carrier and $f_m$ is the modulation frequency. An additional application of the device, because of its high speed characteristics and absence of frequency restrictions, is as a high frequency mixer.

Power handling limitations in the bulk semiconductor switch are imposed by the RF resistance which is attainable when the diode is biased in the high field state at the bias point. Switching is achieved by biasing between the high conduction regions such as 1 and the high impedance region such as 2, FIG. 7. The maximum amount of switching power is that required to either bias the diode back into the high conduction state or to achieve avalanche conditions within the semiconductor. RF voltage required for avalanche breakdown is on the order of 100 volts in the device shown in FIG. 7, so the equivalent RF power is a few hundred watts. However, when biased at point 2, the d.c. power to the device is $I_{SAT} \times V_{BIAS}$ which is on the order of 5 watts for practical devices operating in a continuous mode.

Since the frequency limitations of this type of device are beyond 60 GHz, the reactive impedance characteristics are nearly constant with frequency within the entire microwave spectrum. This is especially important for applications in the millimeter frequency range. Applications as microwave mixers with high burn-out capability in millimeter wave areas are also possible with this device.

Referring to FIGS. 9 and 10, device 36 is shown connected in a rectangular waveguide 37 to serve as a switch responsive to switching pulse 38. The device is centrally located in the waveguide to attain maximum reflection of the impinging microwave signal. FIG. 11 shows a "dumbbell" device 41 serving as a switch in a microstrip transmission line 42 including ground plane 43 and dielectric 44. This configuration facilitates applications in microwave integrated circuits. A coaxial circuit, shown in FIG. 12, employing a circulator 45 and coaxial matching transformer 46 can utilize the mesa device 47 as a microwave modulator whereby the bypassed microwave signal is terminated in the resistor 48.

Thus, it is seen that there has been provided a simple high speed bulk semiconductor microwave switching device.

We claim:

1. A semiconductor switching device including a body of semiconductor material and spaced terminal means on said body whereby at least a portion of said body is disposed between said terminals in which said body of material comprises $n$-type semiconductor $Ga_{1-x}Al_xAs$ where $x$ is 0.40 ± 0.03 to provide energy bands having small energy differences and which switches from a low resistance to a high resistance with current saturation responsive to a switching voltage applied between said terminals.

2. A semiconductor device as in claim 1 wherein $x = 0.40$.

* * * * *